United States Patent [19]
D'Souza

[11] Patent Number: 5,323,107
[45] Date of Patent: Jun. 21, 1994

[54] ACTIVE PROBE CARD

[75] Inventor: Daniel B. D'Souza, Santa Clara County, Calif.

[73] Assignee: Hitachi America, Ltd., Brisbane, Calif.

[21] Appl. No.: 956,453

[22] Filed: Oct. 2, 1992

Related U.S. Application Data

[63] Continuation of Ser. No. 685,878, Apr. 15, 1991, abandoned.

[51] Int. Cl.$^5$ .................. G01R 1/073; G01R 31/28
[52] U.S. Cl. ...................... 324/158 P; 324/158 F; 371/22.3
[58] Field of Search ................ 371/22.1, 22.3; 324/72.5, 158 P, 158 F

[56] References Cited

U.S. PATENT DOCUMENTS

| | | | |
|---|---|---|---|
| 4,038,599 | 7/1977 | Bove et al. | 324/158 P |
| 4,417,204 | 11/1993 | Dehmel et al. | 324/158 F |
| 4,465,972 | 8/1984 | Sokolich | 324/158 P |
| 4,517,512 | 5/1985 | Petrich et al. | |
| 4,626,775 | 12/1986 | Cho et al. | 324/158 F |
| 4,724,377 | 2/1988 | Maelzer et al. | 324/158 F |
| 4,963,824 | 10/1990 | Hsieh et al. | 324/158 F |
| 4,975,639 | 12/1990 | Hiwada et al. | 324/158 P |
| 5,014,002 | 5/1991 | Wiscombe et al. | 324/158 P |
| 5,020,219 | 6/1991 | Leedy | 324/158 P |
| 5,055,780 | 10/1991 | Takagi et al. | 324/158 F |

Primary Examiner—Ernest F. Karlsen
Attorney, Agent, or Firm—Flehr, Hohbach, Test, Albritton & Herbert

[57] ABSTRACT

An active probe card having integral test circuitry directly attached to the probe card. The probe card includes a circuit board wherein the test circuitry is mounted on the circuit board. In an alternate embodiment, the probe card also includes an on-board signal selection device. The test circuitry applies test signals through probe pins to integrated circuit input pads and samples the test signal responses at integrated circuit output pads. The orientation of the test circuitry attached to the each pin, i.e., input or output, is field programmable. The test circuitry may use boundary scan testing methodology. The active probe card's test circuitry may implement the test methodology of IEEE standard 1149.1 or analog test circuitry to determine the ac and dc parametric characteristics of the integrated circuit. The active probe card may include terminals to which Automatic Test Equipment (ATE) can be attached.

11 Claims, 11 Drawing Sheets

| FUSE | UNI IN | UNI OUT | BI | TRI |
|------|--------|---------|----|----|
| L1 | R | X | X | X |
| L2 | X | R | X | X |
| L3 | X | X | R | X |
| L4 | X | X | X | R |
| L5 | R | R | R | X |

R — RETAIN

X — DISCONNECT

*FIG. 6*

ACTIVE PROBE CARD

This is a continuation of application Ser. No. 07/685,878 filed Apr. 15, 1991, now abandoned.

The present invention relates generally to integrated circuit testing apparatus and particularly to an integrated circuit probe card having on-board test circuitry.

BACKGROUND OF THE INVENTION

Current testing of high density integrated circuits is accomplished by large, very expensive test apparatus. As is currently well known in the art, integrated circuits are evaluated by connecting the peripherally arranged input and output pads or traces of the integrated circuit to the test set via a probe card.

Typically, probe cards consist essentially of a circular or rectangular printed circuit board having a centrally located circular opening which provides access to the integrated circuit to be tested, one or more concentric rings of spaced conductive pads on the bottom side of the board surrounding the opening, and connector terminals connected to the conductive pads via conductive traces. A radial array of conductive probes, which are positioned to engage the traces of the integrated circuit under test, are attached at one end to the conductive pads and the distal end extends into the opening.

Generally, the probe pins are pressed against the pads to establish electrical contact. In some instances, the pins may be constructed to include mechanical switches, commonly referred to as edge sensors, which become open when probe pin contact of sufficient force to ensure conduction is established The open state informs the test system that the probe card is ready to test the integrated circuit.

Typically, the probe card is attached to the test instrumentation via a long cable. For high speed systems, the impedances within the test arrangement must be accurately matched and the signal time delays accounted for in order to perform accurate testing. A time domain reflectometer (TDR) is typically used to characterize the test system prior to testing The measured system anomalies can be removed from the recorded test data by extensive signal processing once the data has been recorded or compensation and adjustment can be applied while the data is being collected. In either case, having the test apparatus, i.e., the test signal drive circuits and the test signal response sampling circuits, located a distance from the device under test is undesirable.

Additionally, test circuitry used to evaluate integrated circuits must be easily configurable at the user's firm to meet the specific needs of the device under test. Thus, the test signal drive circuits and the test signal response sampling circuits which are connected to the probes via the long cable must be oriented to match the specific nature of integrated circuit terminal under tested. In other words, the integrated circuits input circuits must be aligned with a test probe which is connected to a test signal drive circuit and the output circuits must be aligned with the test signal sampling circuits.

In an effort to standardize test procedures concerning on-board testing of integrated circuits, the Institute of Electrical and Electronic Engineers (IEEE) promulgated the IEEE Standard Test Access Port and Boundary-Scan Architecture, as described in the document IEEE Std. 1149.1, and incorporated herein by reference. The standard was developed by the Joint Test Action Group (JTAG) and has become known in the integrated circuit industry as the JTAG standard. This standard is adaptable to provide versatile test apparatus which can be configured by the user. An integrated circuit adapter as disclosed in U.S. patent application Ser. No. 07/650,692, entitled "Integrated Circuit Test Adapter" now U.S. Pat. No. 5,096,266 teaches apparatus which configures the JTAG boundary-scan test circuitry to fulfill the current needs of the device under test. This application in herein incorporated by reference.

The specified technique enables integrated circuits to be tested using boundary-scan methodology after the integrated circuits have been permanently installed on a circuit board. However, the JTAG standard circuitry can be adapted to be incorporated into a probe card, creating an active probe card.

The present invention is an active probe card having boundary-scan test circuitry attached directly to the probe pins. In this arrangement, the test circuitry is not separated from the device under test. Therefore, costly time delay and impedance mismatch compensation circuitry is eliminated from the test arrangement.

An objective of the present invention is to enable the testing to be controlled by a workstation or personal computer. Boundary-scan test techniques are especially amenable to control by workstations and personal computers.

Another objective of the present invention is to provide a versatile probe card which can have the test pin orientations, i.e., input or output, programmed in the field to match a specific device under test.

Another object of the present invention is to provide a probe card which includes boundary-scan test circuitry, but also can be operated in conjunction with Automatic Test Equipment (ATE). Thus, a probe card mode of operation which makes the boundary scan circuitry invisible to other test circuitry is necessary.

SUMMARY OF THE INVENTION

In summary, the present invention is an active probe card having integral test circuitry which uses a boundary-scan testing methodology The interconnections between the active probe card and the integrated circuit is accomplished by standard probe pins or other means which are well known in the art. The test circuitry applies test signals through the probe pins to the integrated circuit input pads and samples the test signal responses at the integrated circuit output pads. The orientation of the test circuitry attached to each pin, i.e., input or output, is field programmable.

Preferably, the active probe card's test circuitry is designed to implement the test methodology of IEEE standard 1149.1. However, the invention should not be construed to be limited to the use of this test standard only.

An alternative embodiment includes terminals on the active probe card to which ATE can be attached. In this embodiment, the boundary-scan test circuitry operates in two modes. One which tests the integrated circuit as per the boundary-scan methodology and a second mode which makes the boundary-scan test circuitry transparent. In the second mode, the externally generated test signals pass to and from the integrated circuit under test unimpeded.

Another alternative embodiment, incorporates analog test circuitry on the active probe card to determine the ac and dc parametric characteristics of the integrated circuit.

BRIEF DESCRIPTION OF THE DRAWINGS

Additional objects and features of the invention will be more readily apparent from the following detailed description and appended claims when taken in conjunction with the drawings, in which:

FIG. 6 shows the fuse retention chart for each available cell orientation;

DESCRIPTION OF THE PREFERRED EMBODIMENT

Figure 1A:
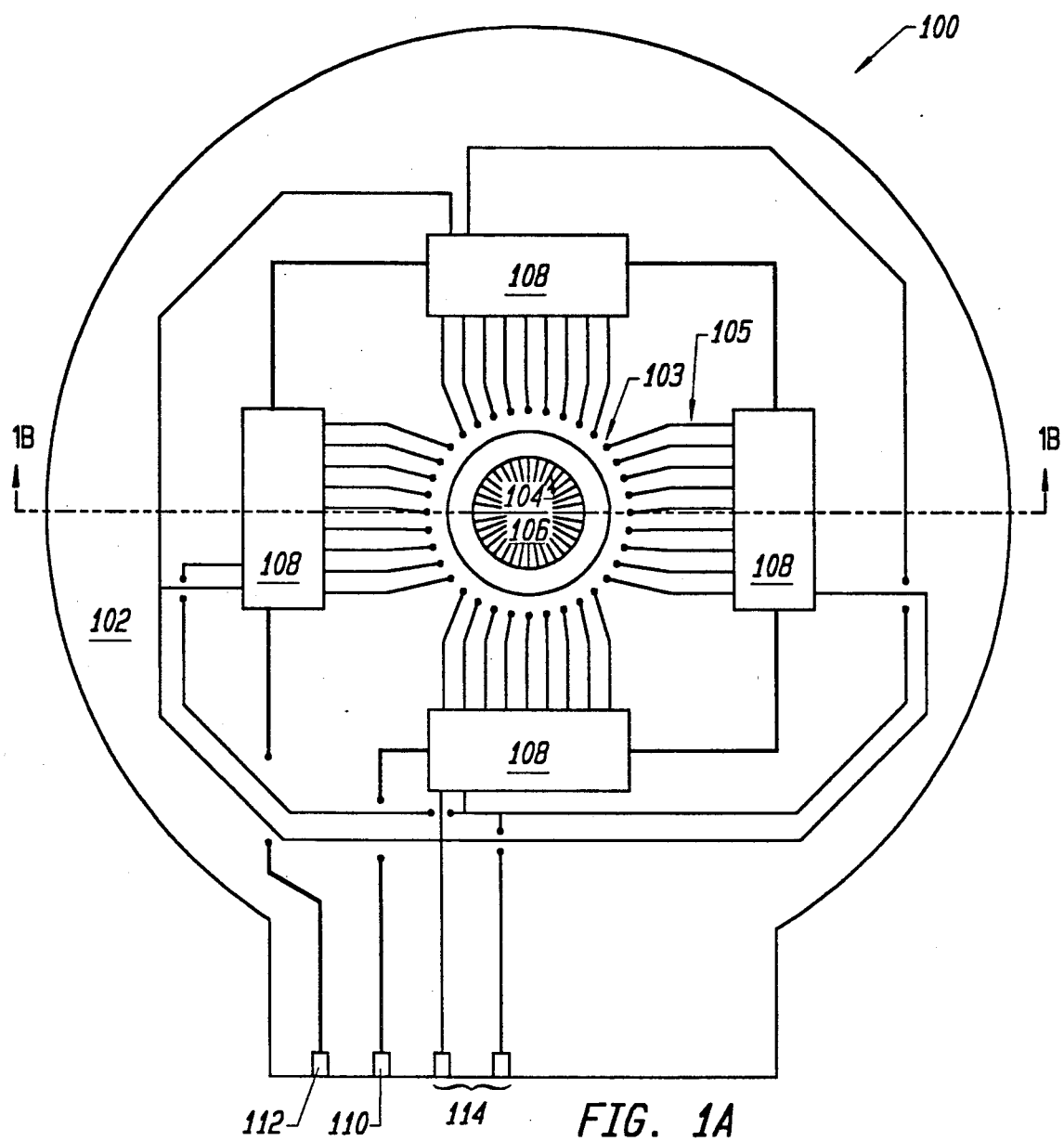
FIG 1A depicts the preferred embodiment of the invention.
Figure 1B:
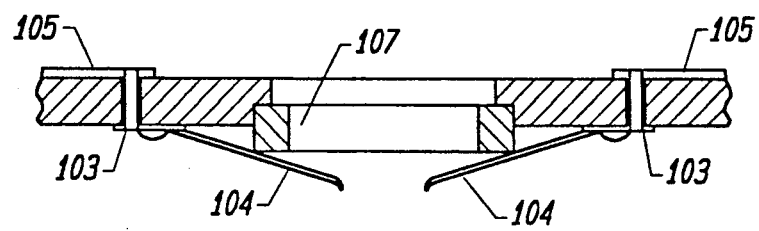
FIG 1B depicts a cross sectional view of the preferred embodiment in FIG 1A.

Referring to FIG. 1A, there is shown a top view of a preferred embodiment of the present invention. The active probe card consist essentially of a circular or rectangular printed circuit board 102 having a centrally located circular opening 106 which provides access to the integrated circuit to be tested (not shown), one or more concentric rings of spaced conductive pads 103 (through connectors) surrounding the opening, and conductive traces 105 connecting the test circuits 108 to the conductive pads 103. A radial array of conductive probes 104, which are positioned to engage the traces of the integrated circuit under test, are attached at one end to the conductive pads 103 and the distal end extends into the opening 106. See FIG. 1B for a cross sectional view of the area surrounding the central opening. An annular ring 107 constructed of anodized aluminum, or some other non-conductive material, is positioned beneath the probes 104 to provide a fulcrum upon which the probes 104 are supported. For added support, the probes may be epoxied at the point of contact with the annular ring 107.

As an alternative to having probe pins as the apparatus to contact the integrated circuit under test, it is foreseeable that the present invention would be operable with membrane probe apparatus and other forms of probe apparatus known in the art. Additionally, to facilitate high speed operation, a ground plane (not shown) may be included on the top and/or bottom of the active probe card circuit board 102.

The boundary-scan test circuitry is housed in integrated circuits 108. The arrangement of the circuit packages is preferably symmetric about the integrated circuit under test so that significant signal propagation delays and losses are avoided. The test circuits are desirably positioned as near to the device under test as is possible. Nonetheless, it is foreseeable that for slower circuit applications the test circuitry could be housed in a single integrated circuit and conductive traces could be arranged to carry the test signals to the probe array.

Referring to FIG 1A, test data is supplied to the test circuits via terminal 110 and the responses to the test data are available at terminal 112. The remaining two ports 114 are used to supply the test circuitry with control and clock signals An important feature of this invention is that only four terminals 110, 112, 114 are used to load data 110, control the test 114, and retrieve output data 112 for testing an integrated circuit of any pin number.

Many forms of test algorithms and apparatus have been researched. One, IEEE standard 1149.1, has come to the forefront. The active probe card invention, as described herein, utilizes this new test methodology as an example of the circuitry which may be incorporated into a probe card. However, active probe cards incorporating other, non-standardized circuitry are foreseeable. In fact, the present invention can be utilized to add any form of peripheral circuitry to test an integrated circuit. Other known applications include incorporating analog test circuitry into the active probe card to facilitate ac and dc parametric testing.

Figure 2:
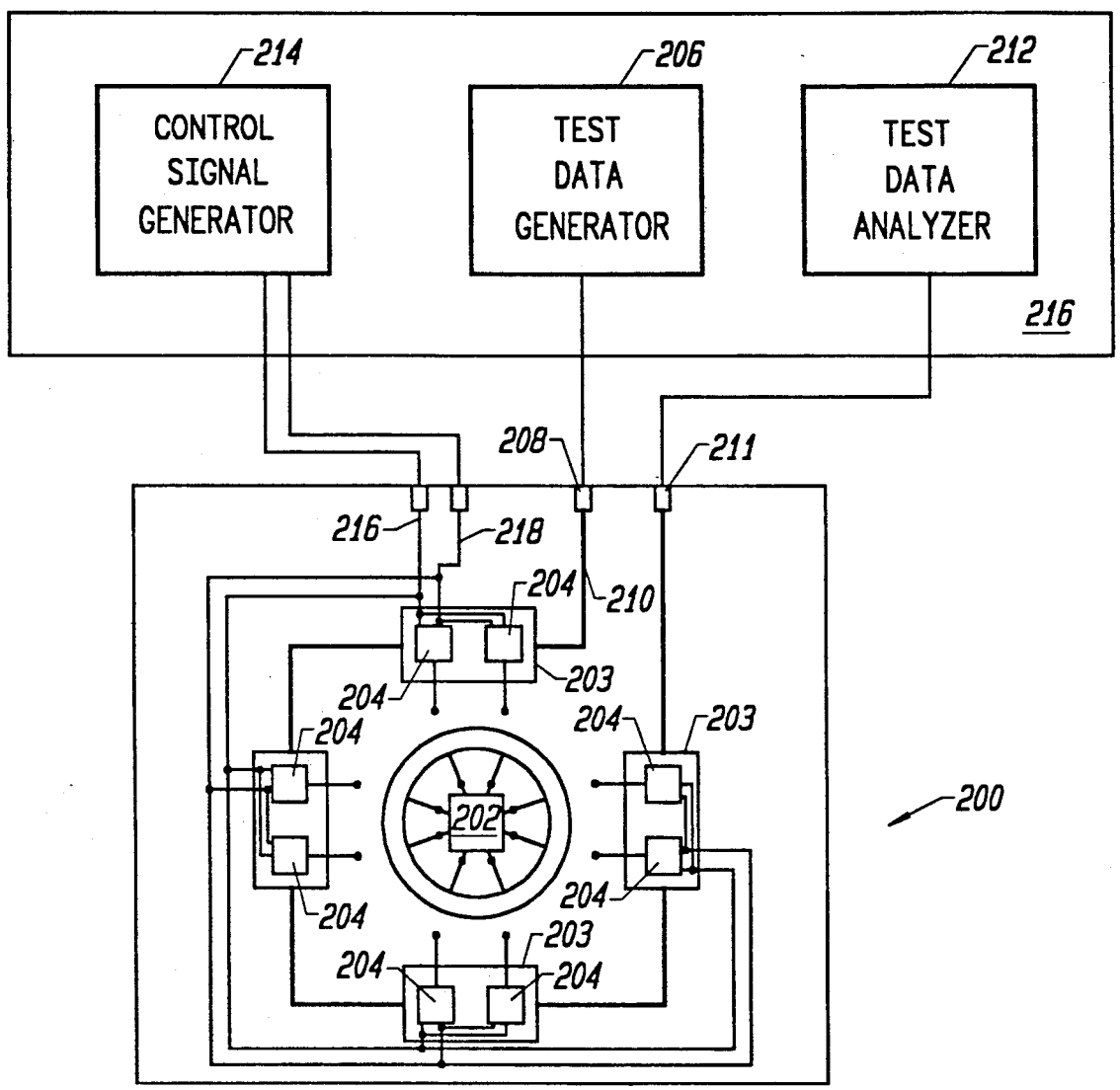
FIGS. 2 depicts a simplified, illustrative embodiment arranged for testing an 8-pin integrated circuit.

FIG. 2 depicts the basic test circuitry arrangement mounted upon an active probe card 200, as called for in IEEE standard 1149.1. As a simple example, the depicted card is designed to test an eight pin integrated circuit 202. The standard uses specially designed integrated circuits 203 having control circuitry (not shown) and a number of registers formed into cells 204 integrated into a typical integrated circuit 203. The standard uses boundary-scan techniques in which a register circuit or cell is attached to each input and output lead of the standard integrated circuit. The cells are indicated by reference number 204. The test data is loaded serially from the test data generator 206 through port 208 into the cell arrays as depicted by the heavy interconnection 210. Each integrated circuit 203 is equipped with a bypass register (not shown) to enable one or more integrated circuits to be bypassed. After the cells drive the input terminals of the test integrated circuit and the cells connected to the output ports of the test integrated circuit have stored the responses to the input signals, the output test data is retrieved at port 211 to be analyzed 212. Control signals are provided to the test circuits by the control signal generator 214 via circuit traces 216 and 218. These signals control the arrangement and application of the data to the device under test. Another important feature of the invention is that the control signal generator 214, the test data generator 206, and the test data analyzer 212 are each a portion of a single personal computer 216. The operation of the test circuitry is described in more detail with respect to FIG. 3.

Figure 3:
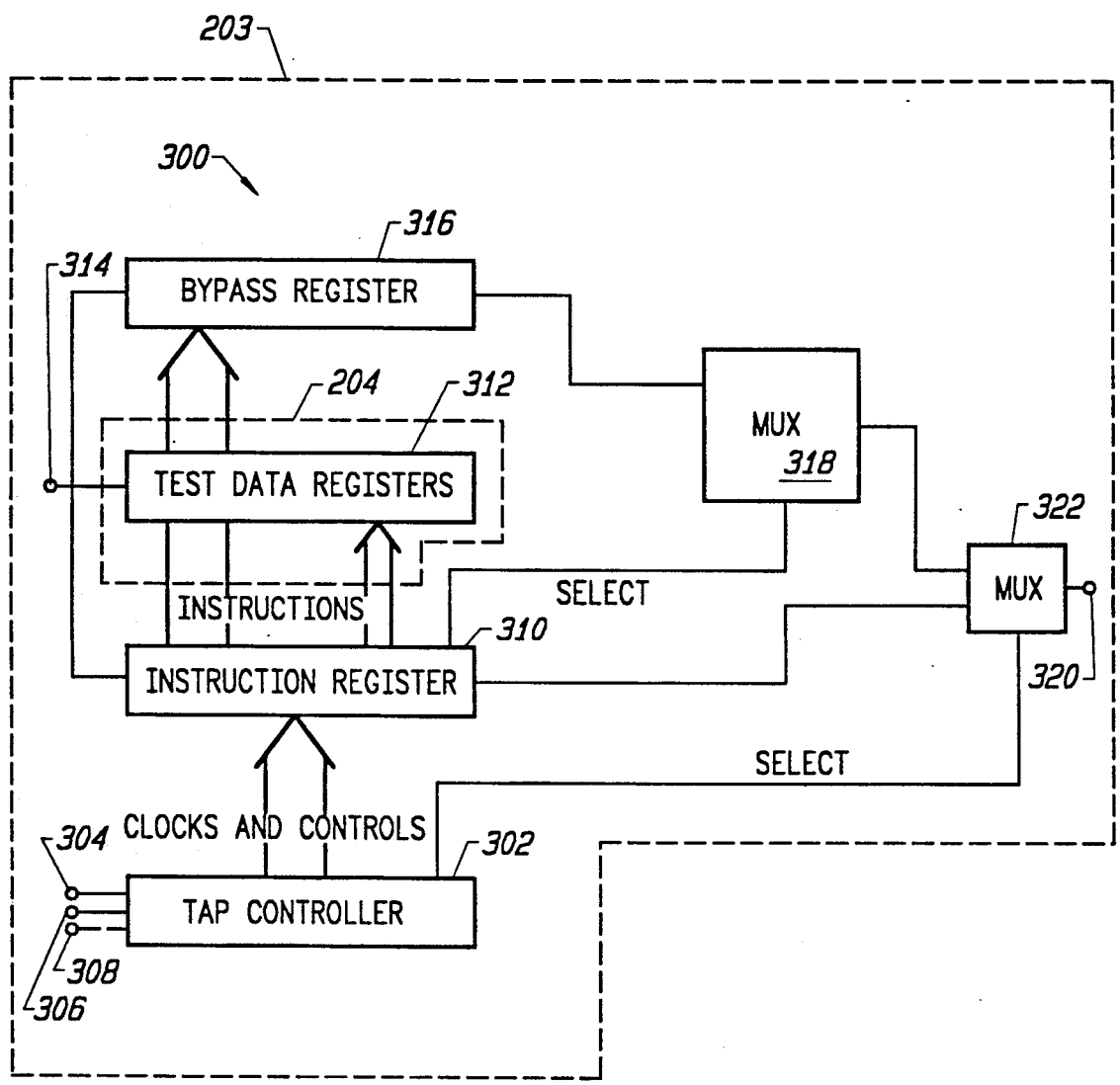
FIG. 3 is a block diagram depicting the interconnections of the main functional blocks of the IEEE 1149.1 standard.

The basic structure of the JTAG based test circuitry 300 housed in a single integrated circuit is depicted in the block diagram of FIG. 3. As noted above, implementation is completely serial in nature. The test access port (TAP) controller 302 receives a control signal 304 and a clock signal 306. An optional reset signal 308 may also be used in some applications, but an additional electrical contact for the reset signal must be added to the probe card. The TAP controller 302 maps the signals 304 and 306 into a large instruction set and a number of clock signals, each of which are loaded into the instruction register 310.

In operation, the test data is loaded into the test data registers 312 which make up the boundary-scan cells 204. The sequence for loading the data from port 314 is controlled by the instruction register 310. A bypass register 316 is also provided. The bypass register 316 provides a path by which test data can be routed without interference to the next test integrated circuit in the series (see FIG. 2). Thus, the serial system can isolate and test individual integrated circuit 202 pin arrangements. The bypass register 316 is selected via the multiplexor (MUX) 318 based upon current instructions in the instruction register and current values of the incoming test data. The output 320 of the MUX 318 is connected to the test data input of the next integrated circuit 203 in the series via MUX 322. The MUX 322 is controlled by the TAP controller 302. It selects either the test data or the instruction data to be shifted out of the test integrated circuit.

Figure 4:
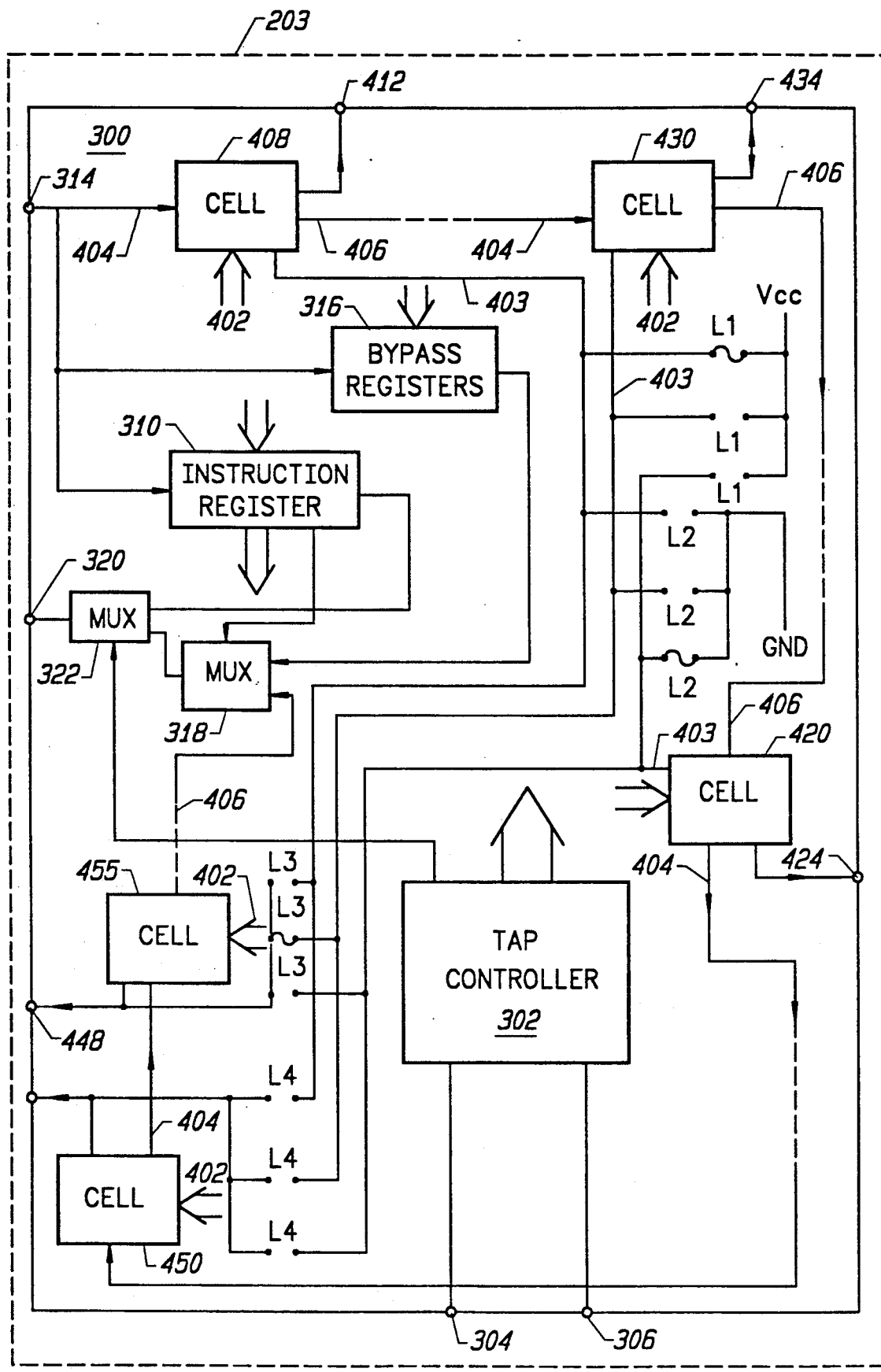
FIG. 4 is a block diagram of a boundary-scan test integrated circuit of the preferred embodiment of the invention.

FIG. 4 is a block diagram showing greater detail of the test circuitry arrangement as used in the preferred embodiment of the invention Each cell has an input for instructions 402 (control information), an input for test data 404, an output for test data 406, an input/output control signal 403, a connection to a probe pin. The connections to probe pins vary depending upon the specific integrated circuit under test. To ensure versatility, each cell is bi-directional to begin with. See FIG. 5 for a bi-directional cell meeting the JTAG standard. However, prior to operation the cells are oriented as bi-directional, uni-directional, or tri-state to match the circuit within the device under test to which the cell will be attached. To orient the cells, the active probe card is driven with a specific set of high current signals to "burn out" a number of fuses associated with each cell. The pattern of fuses which are retained determines the orientation of the cells.

Figure 5:
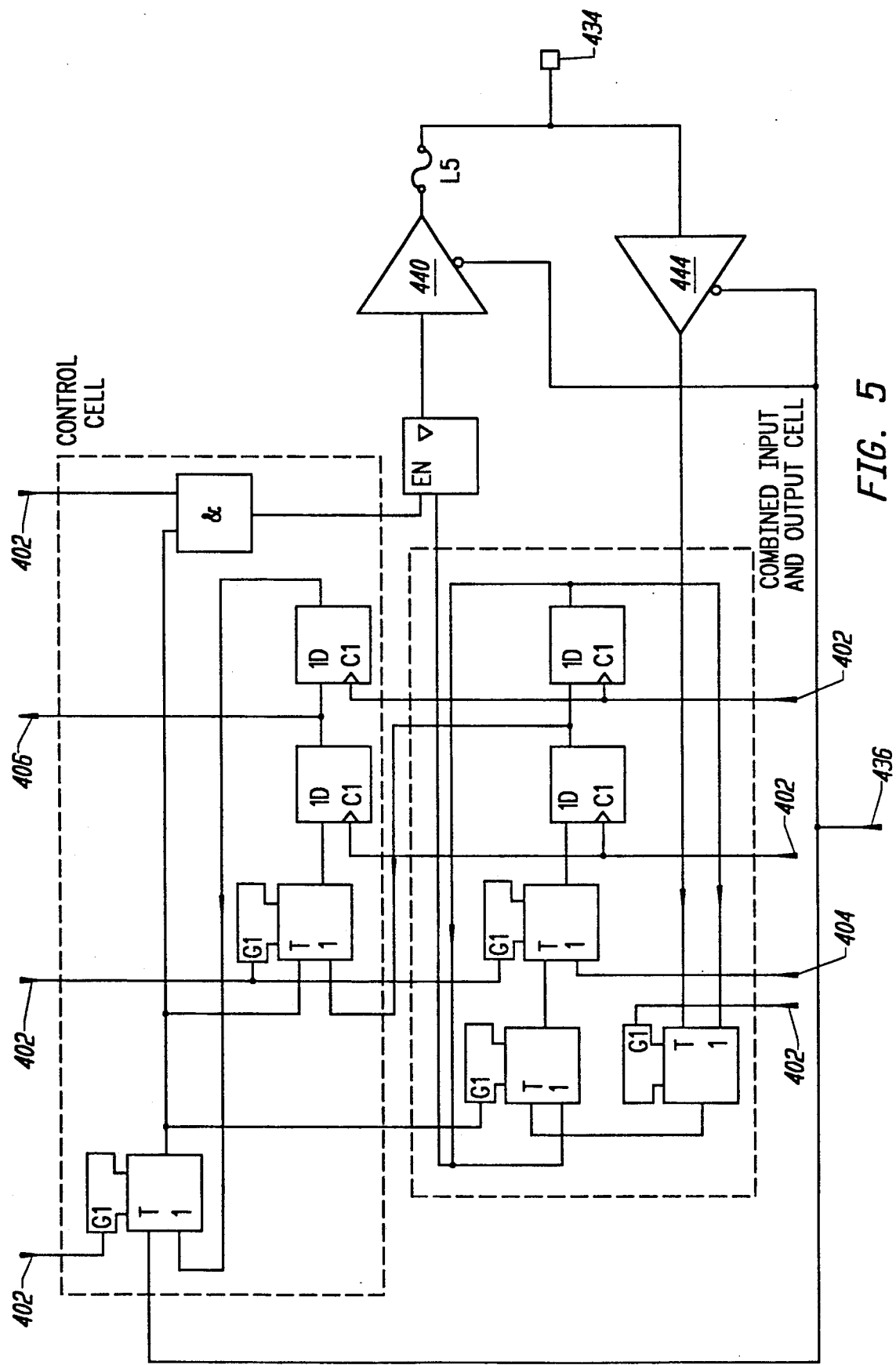
FIG. 5 is a block diagram of a bi-directional cell.

The fuses $L_1$–$L_4$, shown in FIG. 4, and fuse $L_5$, shown in FIG. 5, are "burned out" in a specific pattern by driving them with a large current. The necessary pattern for each cell orientation is depicted in FIG. 6.

For example, if fuses $L_2$, $L_3$, and $L_4$ are disconnected and fuses $L_1$ and $L_5$ are retained, cell 408 becomes a unidirectional input cell. The retained fuse will activate buffer 440 and deactivate buffer 444, ensuring a unidirectional operation. See FIG. 5. Referring to FIG. 4, the cell applies a test signal through port 412 to an input lead of the integrated circuit under test. Another cell, for example cell 430, may monitor the output result responsive to the input drive of cell 408. As a uni-directional output cell, fuses $L_1$ and $L_5$ are retained causing buffer 444 to be active, while buffer 440 is deactivated. Cell 420 has port 422 connected to a terminal of the integrated circuit under test and monitors the output of the integrated circuit.

Figure 7:
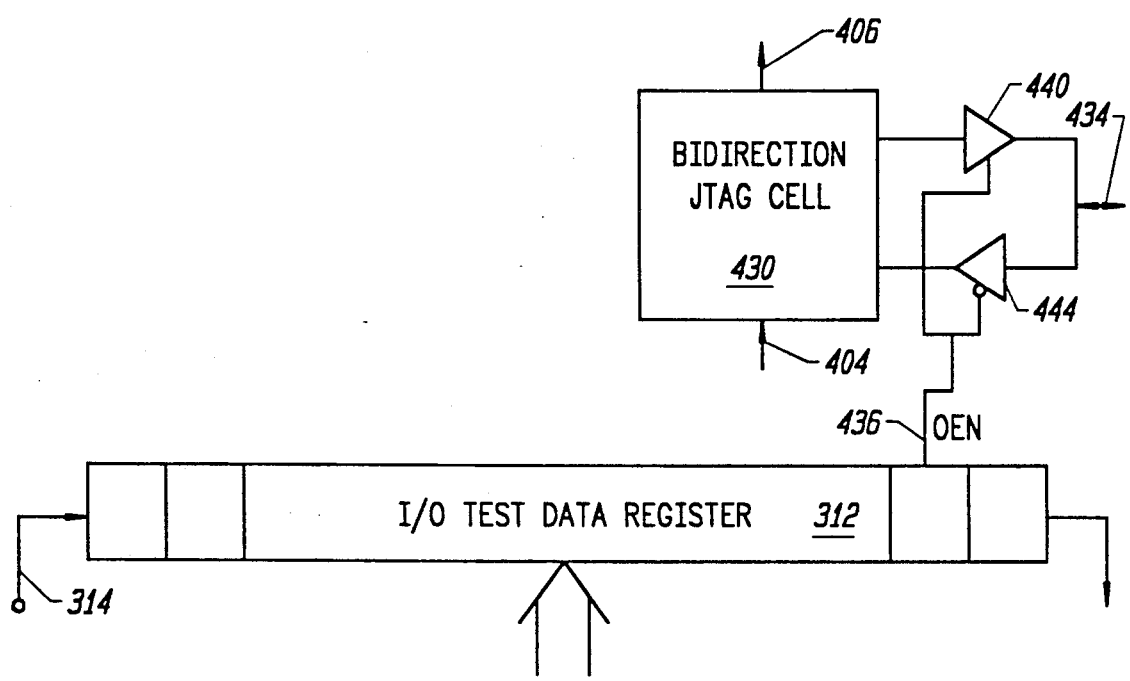
FIG. 7 depicts an alternative means for orienting the cells.

It is not critical that fuses be used to determine the orientation of the cells. This is seen as the simplest method, but a number of shift registers can be incorporated into the adapter circuit as part of the Test Data Register to select the orientation of the cells as instructed by the instruction register This alternative arrangement is depicted in FIG. 7.

In summary, the test data is loaded into the cells in a serial fashion until the proper signals are aligned with the inputs of the integrated circuit. The response to those inputs are monitored by cells at the output terminals of the integrated circuit under test. This describes utilization of uni-directionally oriented cells. However, in some applications the associated integrated circuit may utilize bi-directional input/output terminals or have tri-state signal levels. The IEEE standard has standardized cell circuitry for testing these kinds of ports also.

Figure 8:
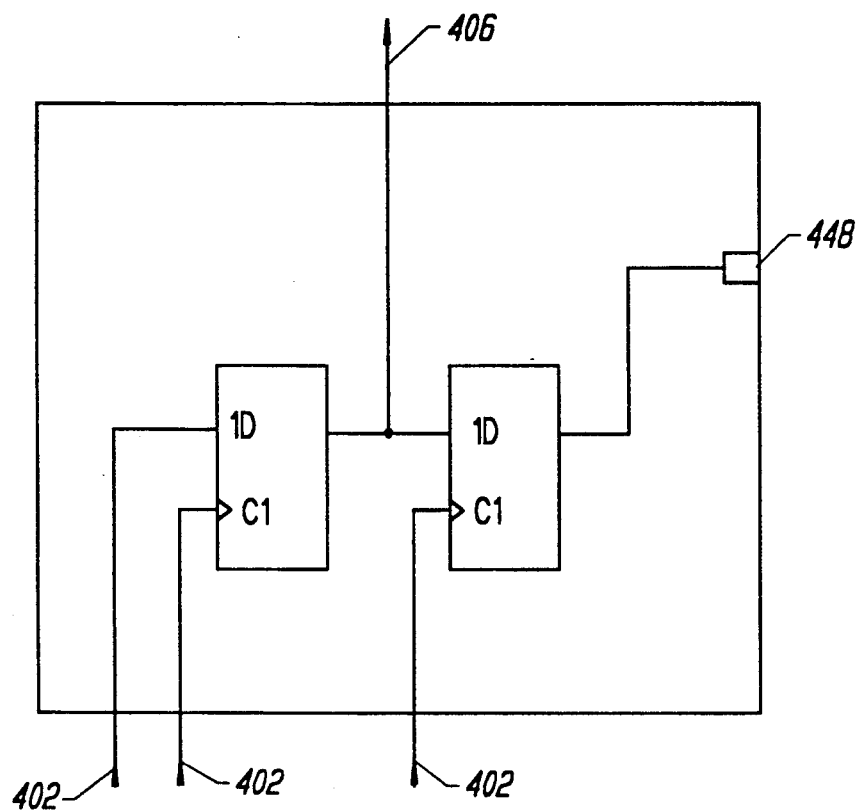
FIG. 8 is a block diagram of a unidirectional cell.

For example, cell 430 of FIG. 4 represents a bi-directional cell where the signals from and to the integrated circuit under test flow in both directions. Orientation is determined by retaining fuses $L_3$ and $L_5$. Port 434 is attached to the integrated circuit under test. The output enable cell 455, via contact 448, instructs the integrated circuit under test which direction the bi-directional pin(s) is operating. The output enable signal is generated as a test signal at cell 455 exactly as any other test signal is passed to the integrated circuit under test However, as a cell associated with an enabling signal for the integrated circuit, the signal will always flow in one direction; therefore, a simple unidirectional cell is used. A simple unidirectional cell is depicted in FIG. 8.

Similarly, tri-state cells (not shown), as called for in IEEE std. 1149.1, are selected and operated in much the same manner as the bi-directional cell. It too has a dedicated unidirectional enabling cell 450 incorporated into the active probe card 100. Note that for both the tri-state and bi-directional modes, all of the integrated circuit input/output contacts of the same orientation are operated in one specific state or direction at one time. This is typical for integrated circuits having tri-state or bi-directional inputs and outputs. If, however, a configuration is needed wherein a number of bi-directional contacts must operate in conflicting directions at any one time, a custom active probe card can be manufactured to meet the specific demands of that integrated circuit. One objective of the current invention is to design the active probe card to be flexible and user configurable in the field. However, as in the case of conflicting directions or states, some applications will require customized active probe cards to be constructed. Moreover, many standard integrated circuits do not use bi-directional or tri-state signals; therefore, a series of probe cards may be constructed to enable the user to orient the cells as input or output cells only. In an application such as this, the tri-state enable cell and the output enable cell would not be included in the active probe card circuitry.

It is expected that an active probe card which is to test a 256 pin integrated circuit would require approximately 5000 gates to implement. These gates, which are used to construct the cells and control circuitry, may be created in any of the many techniques currently used by those skilled in the art of integrated circuit manufacturing.

Figure 9:
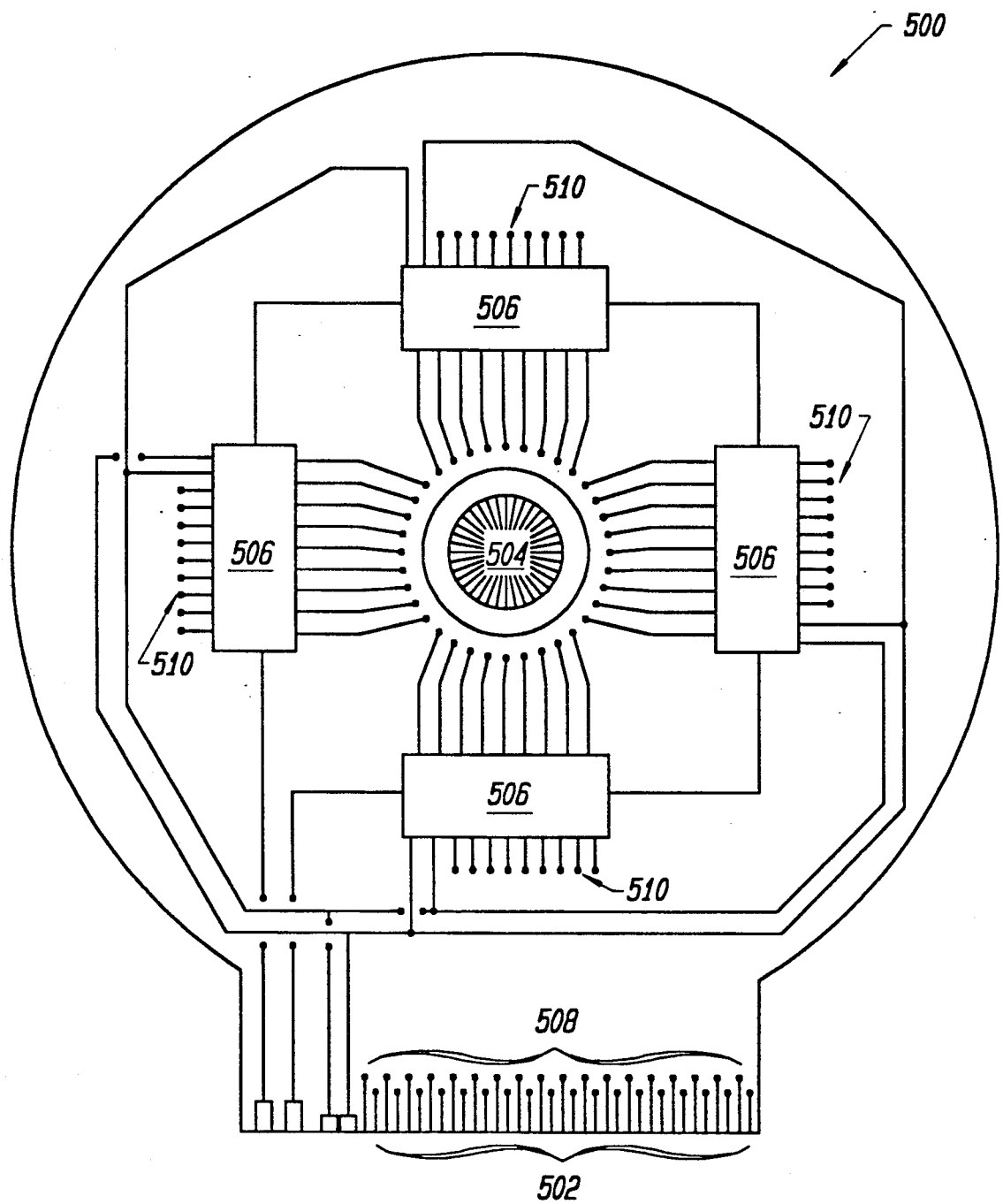
FIG. 9 depicts an alternative embodiment of the present invention.

An alternative embodiment of the present invention is depicted in FIG. 9. In this embodiment, Automatic Test Equipment (ATE) can be attached to the active probe card 500 through ports 502 to drive each of the probe pins 504. This embodiment of the active probe card has two modes. In the boundary-scan test mode, the active probe card's on-board test circuitry 506 will test the integrated circuit under test as described in the foregoing text. However, in the external test signal mode, the boundary-scan test circuitry becomes transparent and the external test signals applied to terminals 502 may pass unimpeded to the integrated circuit under test. The signals applied at terminals 502 pass to the other side of the active probe card via through ports 508. The traces reemerge at each integrated circuit 506 through a corresponding set of through connectors 510.

Figure 10:
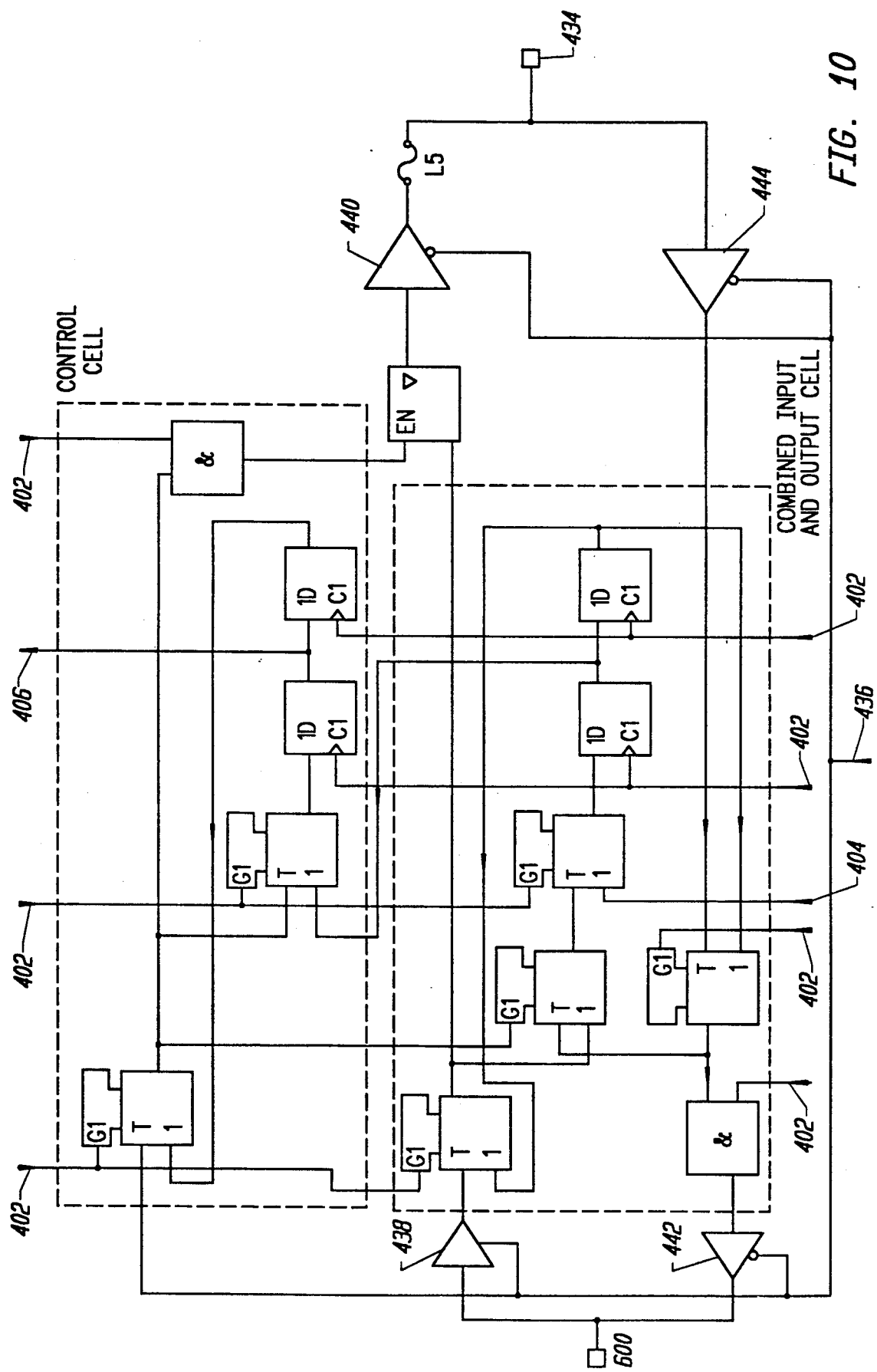
FIG. 10 depicts a bi-directional cell of the alternative embodiment.

To facilitate this embodiment, the configurable bi-directional cells are of the form shown in FIG. 10. In this embodiment, the standard test instrumentation is attached to port 600 and probe pin is attached to port 602. The configuration (direction of operation) is oriented as discussed previously However, the TAP controller generates an extra command which will instruct the cell as to the mode of operation. In the transparent mode, the signal at port 600 is passed through the cell to port 602, if the cell was oriented as an unidirectional input cell. The opposite signal flow would occur when the cell is oriented as a unidirectional output cell.

Figure 11:
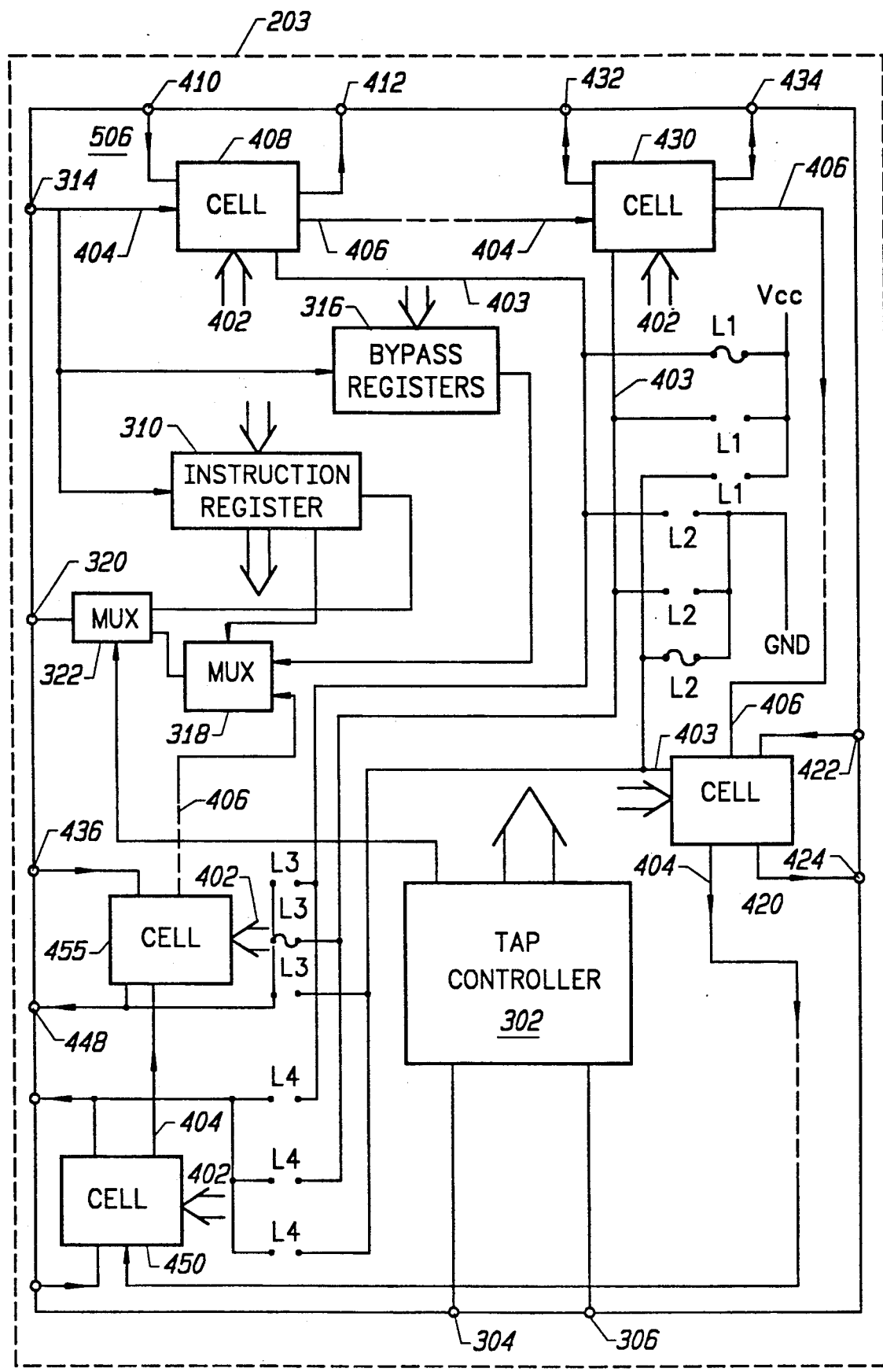
FIG. 11 depicts a block diagram of a boundary-scan test integrated circuit of the alternative embodiment.

FIG. 11 depicts a test integrated circuit configured to operate in both modes. Note that the only difference from FIG. 4 is that each cell has two ports. For example, cell 408 is capable of driving the probe pin with a self generated signal through port 412 or it can drive the probe pin with an external test signal which is receives from port 410. Also note that the bi-directional enable cell 455 now has a port which can accept signals from an external source as well.

Another alternative embodiment replaces the boundary-scan test architecture with analog circuitry. The analog circuitry can be utilized to test ac and dc parametric characteristics of integrated circuits. Alternatively, the boundary-scan test circuits could be augmented by the analog circuitry. This arrangement would provide an extremely versatile active probe card.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. An active probe card for testing an integrated circuit comprising:
   a circuit board;
   test circuitry mounted on said circuit board having a plurality of test signal ports, said test circuitry including active circuit means for driving digital test signals and sample digital test signal response to and from said integrated circuit;
   means, integral to said active probe card, for directly conductively connecting said plurality of test signal ports to an array of connectors of the integrated circuit under test
   second connecting means, integral to said active probe card, for connecting second test signals to said test circuitry; and
   said test circuitry further includes test signal selection means for selecting serial or second test signals to apply to said integrated circuit.

2. The active probe card of claim 1 wherein said test circuitry conforms to Institute of Electronic and Electrical Engineers standard 1149.1.

3. The active probe card of claim 1 wherein said conductively connecting means is a plurality of conductive traces connected to said plurality of test signal ports, a conductive pad connected to each conductive trace, a probe pin having one end conductively connected to said pad and its distal end extended to establish contact with one of the connectors in said connector array of the integrated circuit under test.

4. The active card of claim 3 wherein said circuit card defines a centrally located opening to provide access to the integrated circuit under test and said test circuitry, said conductive traces, and said conductive pads are arranged to surround said opening and said probe pin distal ends extend into said opening.

5. The active probe card of claim 1 wherein said test circuitry implements standardized boundary scan integrated circuit test techniques and methodology.

6. The active probe card of claim 1 wherein said test circuitry further includes bi-directional cells which are user oriented to cooperate with said integrated circuit and said circuit board.

7. The active probe card of claim 1 wherein said test circuitry is positioned on said circuit board to maintain a short distance between the integrated circuit under test and said test circuitry.

8. The active probe card of claim 1 wherein said test circuitry further comprises means for receiving control signals, clock and serial test data inputs and outputing serial test signal responses.

9. The active probe card of claim 1 wherein said active circuit means further comprises:
   a. a plurality of registers for receiving said test data and test signal responses,
   b. test means having drivers, receivers and boundary scan means for implementing standardized boundary scan integrated test techniques and methods,
   c. interconnecting means connecting said registers, and for connecting said registers to said test means, and
   d. a controller comprising means for controlling the movement of test data and test signal responses between said receiving and outputing means and said registers, and means for controlling the movement of test data and test signal responses between said registers and said test means.

10. The active probe card of claim 1 wherein said test circuitry further comprises means for receiving control signals, clock and serial test data inputs and outputing serial test signal responses.

11. The active probe card of claim 1 wherein said active circuit means further comprises:
   a. a plurality of registers for receiving said test data and test signal responses,
   b. test means having drivers, receivers and boundary scan means for implementing standardized boundary scan integrated test techniques and methods,
   c. interconnecting means connecting said registers, and for connecting said registers to said test means, and
   d. a controller comprising means for controlling the movement of test data and test signal responses between said receiving and outputing means and said registers, and means for controlling the movement of test data and test signal responses between said registers and said test means.

* * * * *